(12) United States Patent
You

(10) Patent No.: US 9,197,212 B2
(45) Date of Patent: Nov. 24, 2015

(54) APPARATUS AND METHOD FOR CORRECTING OUTPUT SIGNAL OF FPGA-BASED MEMORY TEST DEVICE

(71) Applicant: UNITEST INC., Gyeonggi-do (KR)

(72) Inventor: Ho Sang You, Seoul (KR)

(73) Assignee: UNITEST INC., Gyeonggi-do (KR)

( * ) Notice: Subject to any disclaimer, the term of this patent is extended or adjusted under 35 U.S.C. 154(b) by 0 days.

(21) Appl. No.: 14/446,482

(22) Filed: Jul. 30, 2014

(65) Prior Publication Data
US 2015/0035561 A1 Feb. 5, 2015

(30) Foreign Application Priority Data
Jul. 31, 2013 (KR) .................. 10-2013-0090905

(51) Int. Cl.
*H03K 19/173* (2006.01)
*G06F 7/38* (2006.01)
*H03K 19/003* (2006.01)
*H03K 19/177* (2006.01)

(52) U.S. Cl.
CPC .... *H03K 19/00369* (2013.01); *H03K 19/17792* (2013.01)

(58) Field of Classification Search
USPC ........ 714/724, 728, 730, 731; 326/39–40, 38, 326/46
See application file for complete search history.

(56) References Cited

U.S. PATENT DOCUMENTS

| 6,871,292 B1* | 3/2005 | Fischer ........................ 713/500 |
| 7,277,812 B1* | 10/2007 | Lilley ............................ 702/117 |
| 2003/0074623 A1* | 4/2003 | Takahashi ..................... 714/738 |

FOREIGN PATENT DOCUMENTS

| JP | 2005-505780 A | 2/2005 |
| JP | 2005-091038 A | 4/2005 |
| KR | 10-0540506 B1 | 1/2006 |

* cited by examiner

*Primary Examiner* — Minh D A
(74) *Attorney, Agent, or Firm* — Rabin & Berdo, P.C.

(57) ABSTRACT

An apparatus and method for correcting an output signal of an FPGA-based memory test device includes a clock generator for outputting clock signals having different phases; and a pattern generator for outputting an address signal, a data signal and a clock signal in response to the clock signals input from the clock generator, and correcting a timing of each of the output signals using flip flops for timing measurement. Wherein the address signal, the data signal and the clock signal, through a pattern generator, are implemented with a programmable logic such as FPGA, thereby shortening the correcting time without the use of an external delay device, and increasing accuracy of output timing of the signal for memory testing, ultimately enhancing performance (accuracy) of a memory tester.

4 Claims, 5 Drawing Sheets

APPARATUS AND METHOD FOR CORRECTING OUTPUT SIGNAL OF FPGA-BASED MEMORY TEST DEVICE

BACKGROUND OF THE INVENTION

1. Field of the Invention

The present invention relates to an apparatus and method for correcting an output signal of an FPGA (Field Programmable Gate Array)-based memory test device, and more particularly, to an apparatus and method for correcting an output signal of an FPGA-based memory test device, wherein output of address, data and clock through a pattern generator to test memory is implemented with a programmable logic such as FPGA and thereby accuracy of output timing of the signal for memory testing may be increased, ultimately enhancing performance (accuracy) of a memory tester.

2. Description of the Related Art

In conventional memory test devices, internal operation is carried out entirely based on a reference clock. As address or data for memory becomes faster, not only individual output timings and phases but also clocks between command signals become different.

Korean Patent No. 540506 (Algorithm pattern producer for testing memory device and memory tester using the same) discloses a technique for a data comparing part configured to compare test data with data produced from a data producing part with respect to individual clock cycles and to store information about fail memory.

Specifically, as illustrated in FIG. 1, in the technique for compensating for the output signal of the memory test device, a delay device 2 per output signal is additionally provided, and the output signal which is directly measured from the outside is applied to the delay device 2, or is fed back to a correcting device 3 to measure a difference between the signals. Then, the signal difference per output is compensated using the delay device 2, thus recompensing the output signal of the memory test device.

However, in the conventional memory test device, the correcting device 3 is separately provided to correct the output signal, and to measure the difference between the signals so as to be compensated again using the delay device 2, undesirably incurring economic and spatial loss.

SUMMARY OF THE INVENTION

Accordingly, the present invention has been made keeping in mind the above problems occurring in the prior art, and an object of the present invention is to provide an apparatus and method for correcting an output signal of an FPGA-based memory test device, wherein output of an address signal, a data signal and a clock signal through a pattern generator is implemented with a programmable logic such as FPGA, thereby shortening the correcting time without the use of an external delay device, and increasing accuracy of output timing of the signal for memory testing, ultimately enhancing performance (accuracy) of a memory tester.

In order to accomplish the above object, the present invention provides an apparatus for correcting an output signal of an FPGA-based memory test device, comprising: a clock generator for outputting clock signals having different phases; and a pattern generator for outputting an address signal, a data signal and a clock signal in response to the clock signals input from the clock generator, the signals being output by correcting timing of each of the output signals using flip flops for timing measurement.

Also, the flip flops may include a first flip flop and a second flip flop configured to receive the output signals of the pattern generator and the clock signals from the clock generator to output signals to PIN1 and PIN2 corresponding to the clock signals, respectively; a third flip flop provided between the first flip flop and PIN1; and a fourth flip flop provided between the second flip flop and PIN2.

As such, the third flip flop may receive the clock signal of the first flip flop and a common clock signal, and the fourth flip flop may receive the clock signal of the second flip flop and the common clock signal.

Further, the flip flops may be configured such that PIN1 and PIN2 output the signals at the same time by correcting a time difference between variable clocks by the third flip flop and the fourth flip flop.

The fourth flip flop may repeat adding the clock signal input from the third flip flop and the clock signal of the second flip flop so as to output the clock signal at the same time as the third flip flop.

In addition, the present invention provides a method of correcting an output signal of an FPGA-based memory test device, comprising: (a) outputting clock signals having different phases by a clock generator; (b) inputting the clock signals to a pattern generator; and (c) correcting output timing of each of the clock signals by flip flops of the pattern generator to output signals.

Further, (c) may comprise: (c-1) inputting output signals of the pattern generator and the clock signals of the clock generator to a first flip flop and a second flip flop of the pattern generator; (c-2) inputting the clock signal of the first flip flop and a common clock signal to a third flip flop; (c-3) inputting the clock signal of the second flip flop and the common clock signal to a fourth flip flop; (c-4) adding the clock signal input from the third flip flop and the clock signal of the second flip flop by the fourth flip flop; (c-5) determining whether the clock signal of the third flip flop is matched with the clock signal of the fourth flip flop; and (c-6) outputting the signals to PIN1 and PIN2 from the third flip flop and the fourth flip flop when the clock signal of the third flip flop is matched with the clock signal of the fourth flip flop in (c-5).

According to the present invention, output of an address signal, a data signal and a clock signal through a pattern generator can be implemented with a programmable logic such as FPGA, thereby shortening the correcting time without the use of an external delay device, and increasing accuracy of output timing of the signal for memory testing, ultimately enhancing performance (accuracy) of a memory tester.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

Hereinafter, a detailed description will be given of the present invention with reference to the appended drawings. Throughout the detailed description, the terms or words used in the specification and claims shall not be construed as being limited to meanings generally used or defined in dictionaries, and shall be understood as having meanings and concepts adapted for the technical spirit of the present invention on the assumption that inventors may appropriately define the concepts of terms in order to more efficiently explain the invention. In the following description, it is noted that, when the detailed description of known techniques related with the present invention may make the gist of the present invention unclear, a detailed description thereof will be omitted.

Figure 1:
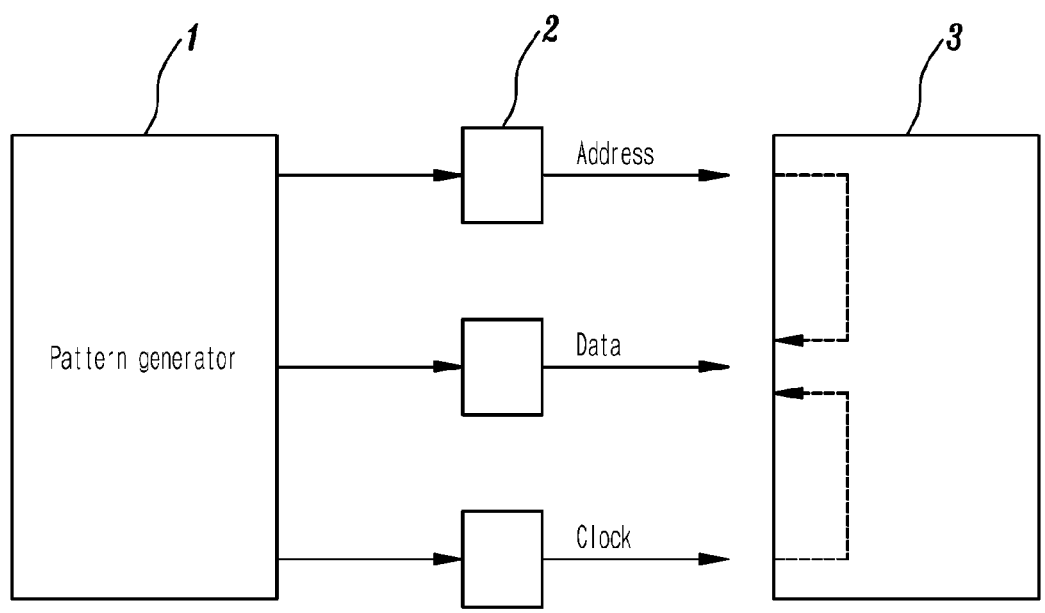
FIG. 1 is a view illustrating a conventional apparatus for correcting an output signal of a memory test device.
Figure 2:
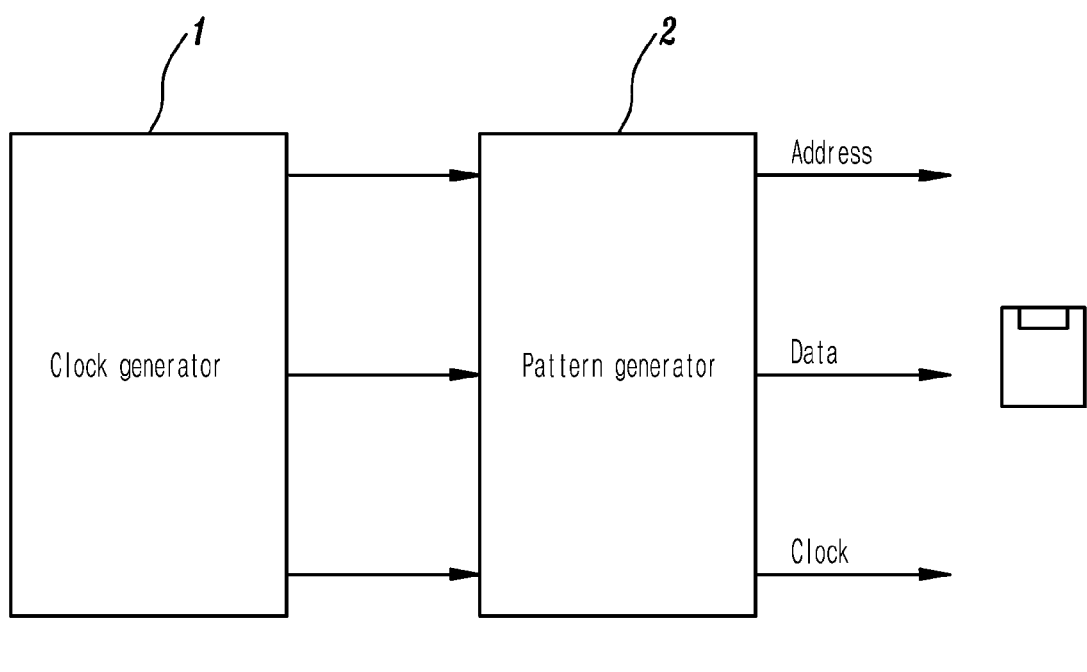
FIG. 2 is a view illustrating an apparatus for correcting an output signal of an FPGA-based memory test device according to the present invention.

As illustrated in FIG. 2, an apparatus A for correcting an output signal of an FPGA-based memory test device according to the present invention comprises a clock generator 1 for generating clocks having different phases, and a pattern generator 1 for outputting an address signal, a data signal and a clock signal in response to the output of the clock generator 1.

Specifically, the clock generator 1 functions to output a plurality of clock signals, and the output clock signals have different phases.

The pattern generator 2 functions to output an address signal, a data signal and a clock signal in response to the clock signals input from the clock generator 1. Under the control of a predefined FPGA programmable logic, flip flops for timing measurement are provided to respective signal output terminals so as to correct the timing of each of the output signals to output the corresponding signals.

Below is a description of the flip flops for timing measurement in the apparatus A for correcting the output signal of the FPGA-based memory test device according to the present invention, with reference to FIG. 3.

Specifically, the first flip flop 1-1 and the second flip flop 1-2 receive the output signal of the pattern generator 2 and the clock signals CLOCK1, CLOCK2 from the clock generator 1, and then output the signals to PIN1 and PIN2 so as to be adapted for the clock signals.

As such, PIN1 and PIN2 are designed to allow for input and output so as to read the state thereof, and the third flip flop 3-1 is provided between the first flip flop 1-1 and PIN1, and the fourth flip flop 3-2 is provided between the second flip flop 1-2 and PIN2.

Specifically, the third flip flop 3-1 receives the clock signal 2-1 of the first flip flop 1-1, and the common clock signal which is the same used as in the fourth flip flop, and then outputs the variable clock signal to the fourth flip flop 3-2. The fourth flip flop 3-2 receives the clock signal 2-2 of the second flip flop 1-2, and the common clock signal which is the same used as in the third flip flop 3-1, and then outputs the variable clock signal to the third flip flop 3-1. The third flip flop 3-1 and the fourth flip flop 3-2 each function to correct the time difference between the variable cocks so that PIN1 and PIN2 may output the signals at the same time.

Particularly, when CLOCK1 is rapidly output, the clock signal of the third flip flop 3-1 is first variable. On the other hand, when CLOCK2 is rapidly output, the clock signal of the fourth flip flop 3-2 is variable. Thus, a difference between the output time of the clock signal of the third flip flop 3-1 and the output time of the clock signal of the third flip flop 3-2 may be deduced.

Therefore, the fourth flip flop 3-2 may repeat adding the clock signal input from the third flip flop 3-1 and the clock signal of the second flip flop 1-2 so as to output the clock signal at the same time as the third flip flop 3-1. Consequently, PIN1 and PIN2 may output the signals at the same time.

Figure 3:
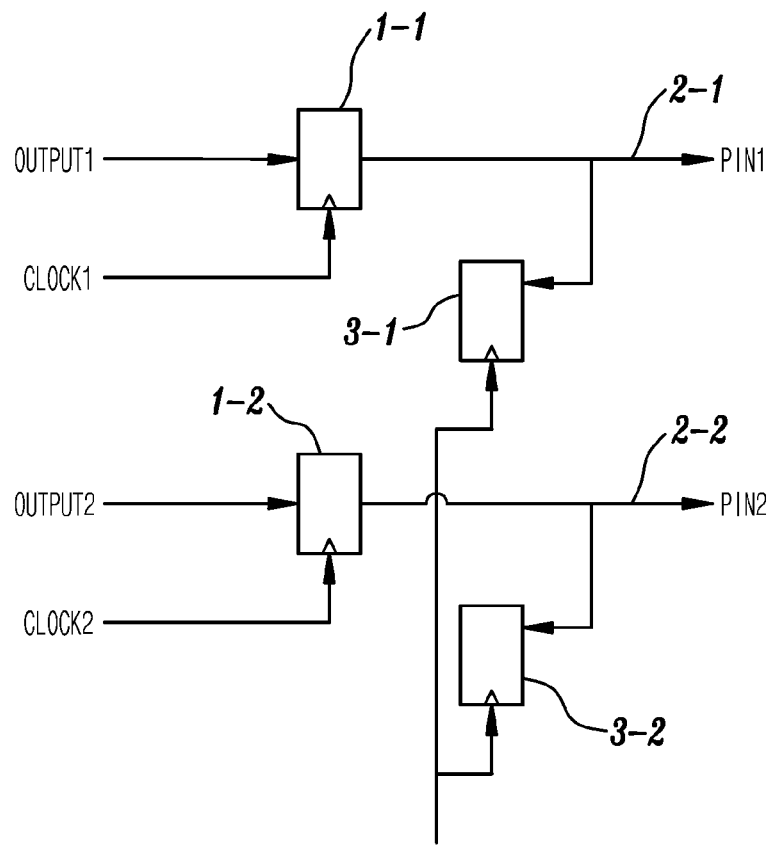
FIG. 3 is a view illustrating the output part of a pattern generator in the apparatus for correcting the output signal of an FPGA-based memory test device according to the present invention.
Figure 4:
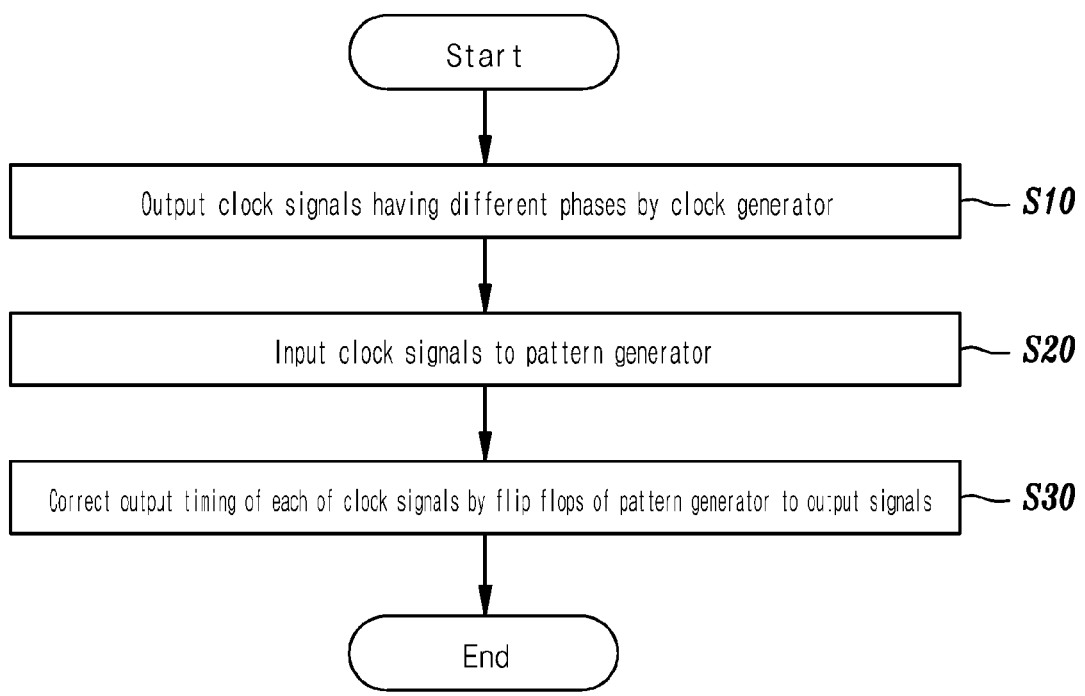
FIG. 4 is a flowchart illustrating a process of correcting the output signal of an FPGA-based memory test device according to the present invention.

With reference to FIGS. 2 to 4, a method of correcting the output signal of the FPGA-based memory test device according to the present invention is described below.

Specifically, clock signals having different phases are output by a clock generator 1 (S10).

Subsequently, the clock signals are input to a pattern generator 2 (S20).

The flip flops of the pattern generator 2 function to correct the output timing of each of the clock signals so as to output the signals (S30).

Figure 5:
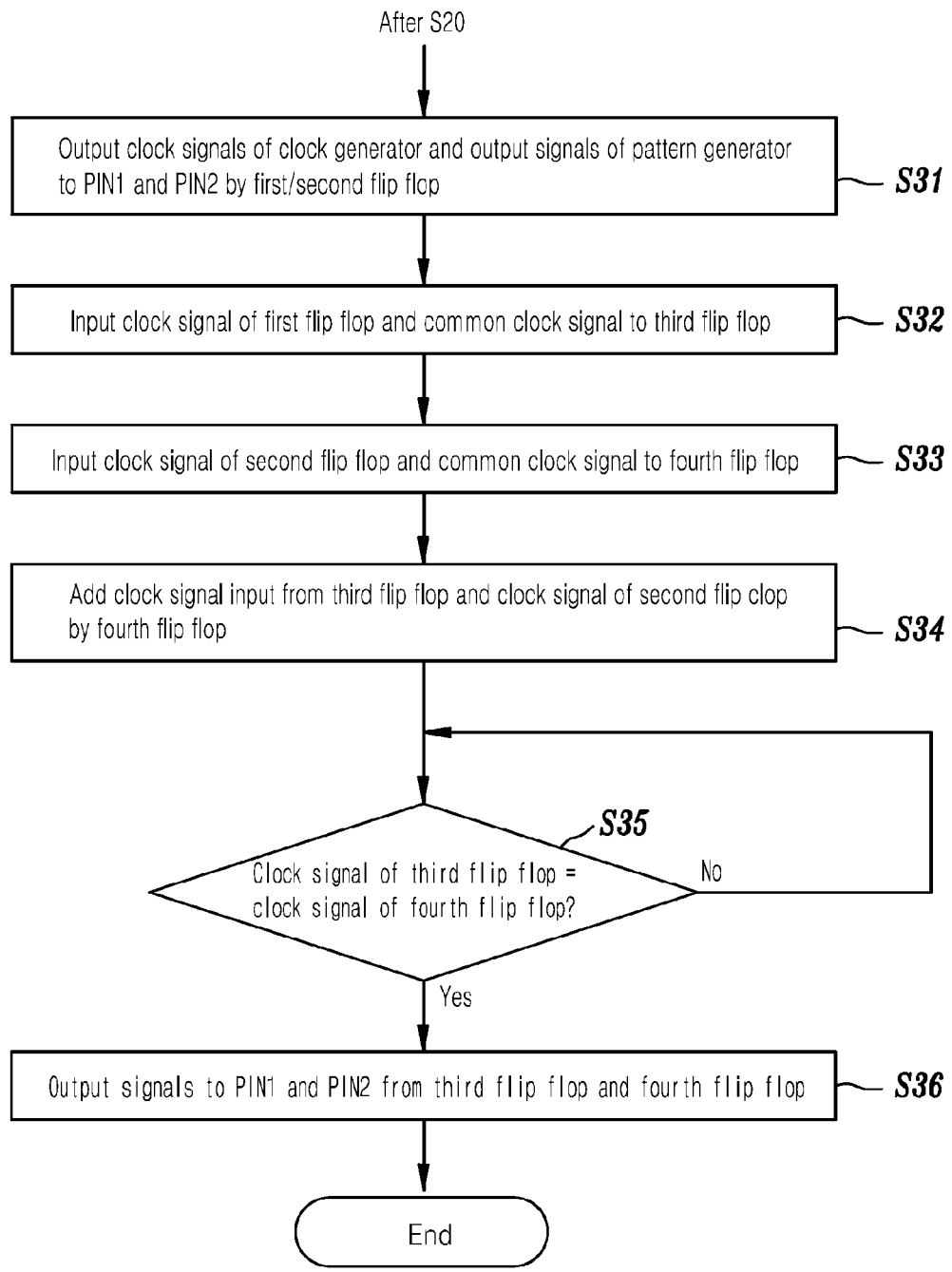
FIG. 5 is a flowchart specifically illustrating S30 in the process of correcting the output signal of an FPGA-based memory test device according to the present invention.

Turning now to FIG. 5, S30 in the method of correcting the output signal of the FPGA-based memory test device according to the present invention is specified below.

After S20, the first flip flop 1-1 and the second flip flop 1-2 of the pattern generator 2 receive the output signal of the pattern generator 2 and the cock signals CLOCK1, CLOCK2 from the clock generator 2 (S31).

Subsequently, the third flip flop 3-1 receives the clock signal 2-1 of the first flip flop 1-1 and the common clock signal (S32).

Subsequently, the fourth flip flop 3-2 receives the clock signal 2-2 of the second flip flop 1-2 and the common clock signal (S33).

Subsequently, the fourth flip flop 3-2 adds the clock signal input from the third flip flop 3-1 and the clock signal of the second flip flop 1-2 (S34).

Subsequently, whether the clock signals output from the third flip flop 3-1 and the fourth flip flop 3-2 are matched with each other is determined (S35).

Based on the result of determination in S35, when the clock signals output from the third flip flop 3-1 and the fourth flip flop 3-2 are matched with each other, the third flip flop 3-1 and the fourth flip flop 3-2 output the signals to PIN1 and PIN2 (S36).

Although the embodiments of the present invention have been disclosed for illustrative purposes, those skilled in the art will appreciate that a variety of different variations and modifications are possible, without departing from the scope and spirit of the invention as disclosed in the accompanying claims. Accordingly, such variations and modifications should also be understood as falling within the scope of the present invention.

What is claimed is:

1. An apparatus for correcting an output signal of a Field Programmable Gate Array (FPGA)-based memory test device, comprising:
   a clock generator outputting clock signals having different phases; and
   a pattern generator outputting an address signal, a data signal and a clock signal in response to the clock signals input from the clock generator, the signals being output by correcting timing of each of the output signals using flip flops for timing measurement,
   wherein the flip flops includes
      a first flip flop and a second flip flop configured to receive the output signals of the pattern generator and the clock signals from the clock generator to output signals to PIN1 and PIN2 corresponding to the clock signals, respectively,
      a third flip flop provided between the first flip flop and PIN1, and a fourth flip flop provided between the second flip flop and PIN2, and wherein the third flip flop receives the clock signal of the first flip flop and a common clock signal, and the fourth flip flop receives the clock signal of the second flip flop and the common clock signal.

2. The apparatus of claim 1, wherein the flip flops are configured such that PIN1 and PIN2 output the signals at the same time by correcting a time difference between variable clocks by the third flip flop and the fourth flip flop.

3. The apparatus of claim 1, wherein the fourth flip flop repeats adding the clock signal input from the third flip flop and the clock signal of the second flip flop to output the clock signal at the same time as the third flip flop.

4. An method of correcting an output signal of a Field Programmable Gate Array (FPGA)-based memory test device, comprising:
   (a) outputting clock signals having different phases by a clock generator;
   (b) inputting the clock signals to a pattern generator; and
   (c) correcting output timing of each of the clock signals by flip flops of the pattern generator to output signals,
   wherein (c) includes
      (c-1) inputting output signals of the pattern generator and the clock signals of the clock generator to a first flip flop and a second flip flop of the pattern generator,
      (c-2) inputting the clock signal of the first flip flop and a common clock signal to a third flip flop,
      (c-3) inputting the clock signal of the second flip flop and the common clock signal to a fourth flip flop,
      (c-4) adding the clock signal input from the third flip flop and the clock signal of the second flip flop by the fourth flip flop,
      (c-5) determining whether the clock signal of the third flip flop is matched with the clock signal of the fourth flip flop, and
      (c-6) outputting the signals to PIN1 and PIN2 from the third flip flop and the fourth flip flop when the clock signal of the third flip flop is matched with the clock signal of the fourth flip flop in (c-5).

* * * * *